United States Patent
Chang

(10) Patent No.: US 8,001,449 B2
(45) Date of Patent: Aug. 16, 2011

(54) SYNDROME-ERROR MAPPING METHOD FOR DECODING LINEAR AND CYCLIC CODES

(75) Inventor: Yaotsu Chang, Kaohsiung (TW)

(73) Assignees: Yao-Chung Chang, Kaobsiung (TW); Calvin Kai-Wen Chang, Henderson, NV (US)

( * ) Notice: Subject to any disclaimer, the term of this patent is extended or adjusted under 35 U.S.C. 154(b) by 1053 days.

(21) Appl. No.: 11/829,327

(22) Filed: Jul. 27, 2007

(65) Prior Publication Data

US 2009/0031193 A1    Jan. 29, 2009

(51) Int. Cl.
    *H03M 13/00*    (2006.01)
(52) U.S. Cl. ........................................ 714/785; 714/763
(58) Field of Classification Search .................. 714/763, 714/785

See application file for complete search history.

(56) References Cited

U.S. PATENT DOCUMENTS

| 4,599,722 A | 7/1986 | Mortimer |
| 4,897,839 A | 1/1990 | Yamagishi et al. |
| 7,243,291 B1 * | 7/2007 | Williams ...................... 714/776 |
| 2003/0070133 A1 * | 4/2003 | Bauman et al. ............... 714/763 |

* cited by examiner

*Primary Examiner* — Sam Rizk
(74) *Attorney, Agent, or Firm* — Pai Patent & Trademark Law Firm; Chao-Chang David Pai

(57) ABSTRACT

A decoding method is presented for error-correcting codes based on the syndrome decoding scheme, which means the set of all syndromes is one-to-one corresponding to the set of all correctable error patterns. The improvement in the high-speed error-correcting capability is achieved by searching a syndrome-error table, which is built upon the mathematical basis: there is a one-to-one correspondence between the set of all syndromes and the set of all correctable error patterns. Two embodiments of the present invention are described. The first embodiment uses a full syndrome-error table, whereas the second uses a partial syndrome-error table. The method includes the following steps: calculating a syndrome corresponding to the received bit string; determining whether the syndrome is a zero bit string; when the syndrome is not a zero bit string, determining an error pattern from the syndrome-error table; and correcting the corrupted codeword using the error pattern.

20 Claims, 4 Drawing Sheets

SYNDROME-ERROR MAPPING METHOD FOR DECODING LINEAR AND CYCLIC CODES

BACKGROUND

1. Field of Invention

The invention relates to error correction decoding. More particularly, the present invention relates to error correction decoding based on the syndrome decoding scheme, which means the set of all syndromes is one-to-one correspondent to the set of all correctable error patterns. Examples using this scheme include linear codes, cyclic codes, etc.

2. Description of Related Art

Error correction coding plays an important role in the digital era since data transmission over a channel is prone to errors due to factors such as fading, channel noise and signal interference. Errors can happen in any communication channels. Because of this, a corrupted form of the transmitted signal will be obtained in the receiver. By using the error-correcting coding, correctable errors will be eliminated and the original transmitted signal will be recovered without the request of re-sending the signals.

The underlying principle of all of these schemes is to add redundancy to the original information message such that the errors during transmission may be detected and corrected. The schemes select a codeword for every message-word to be transmitted. The selected codeword represents the data of the message-word and additionally has a redundant data component, which is used for error-control. The amount of redundancy added is a function of the error-control capability of the scheme. At the receiver, a corrupted form of the transmitted codeword is received, and this corrupted form is called a corrupted codeword. However, if the errors in the corrupted codeword are within the error-control capability of the scheme, the receiver can determine the correct message-word corresponding to the corrupted codeword.

The decoding procedures to remove an error pattern from the corrupted codeword involve the following steps. First, a syndrome corresponding to the corrupted codeword is calculated. The syndrome is the characteristic of the error pattern hiding in the corrupted codeword. Hence, the syndrome is used to identify the error pattern hiding in the corrupted codeword through a decoding process. Once the error pattern is identified, a corresponding correction is applied to the corrupted codeword to remove the error and obtain the original transmitted codeword.

A variety of decoding schemes have been proposed to perform error correction. However, a major drawback of the existing decoding methods is the amount of computing time spent in the decoding process, which makes it difficult to be implemented in the real-time applications. There are two major reasons why these decoding methods are that time-consuming: first, the algebraic computations involved are quite complicated in determining the error pattern; second, some decoding procedures are executed recursively several times.

Thus, there is a need for a faster and simpler error correction decoding scheme, which provides high-speed performance and fits the requirement of most major applications.

SUMMARY

The present invention is directed to a method that performs error-correcting decoding for error-correcting codes based on the syndrome decoding scheme.

An objective of the present invention is to provide a useful decoding method for error-correcting codes based on the syndrome decoding scheme that can be implemented in most major and real-time applications.

Another objective of the present invention is to provide a fast and simple approach for error-correcting decoding of error-correcting codes based on the syndrome decoding scheme.

To achieve the foregoing objectives, and in accordance with the purpose of the present invention as broadly described herein, the present invention provides a method of decoding error-correcting codes based on the syndrome decoding scheme, binary or non-binary, systematic or non-systematic, extended or non-extended. The improvement in the high-speed error-correcting capability is achieved by searching a syndrome-error table. The syndrome-error table is built upon the following mathematical basis: there is a one-to-one correspondence between the set of all syndromes and the set of all correctable error patterns.

Two embodiments of the present invention are described. The first embodiment uses a full syndrome-error table, whereas the second embodiment uses a partial syndrome-error table. The method includes the following steps: calculating a syndrome corresponding to the received codeword; determining whether the syndrome is a zero bit string or not; when the syndrome is not a zero bit string, determining an error pattern by searching the full/partial syndrome-error table; and correcting the corrupted codeword using the obtained error pattern.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the preferred embodiment, with reference made to the accompanying drawings as follows.

DESCRIPTION OF THE PREFERRED EMBODIMENTS

Figure 1A:
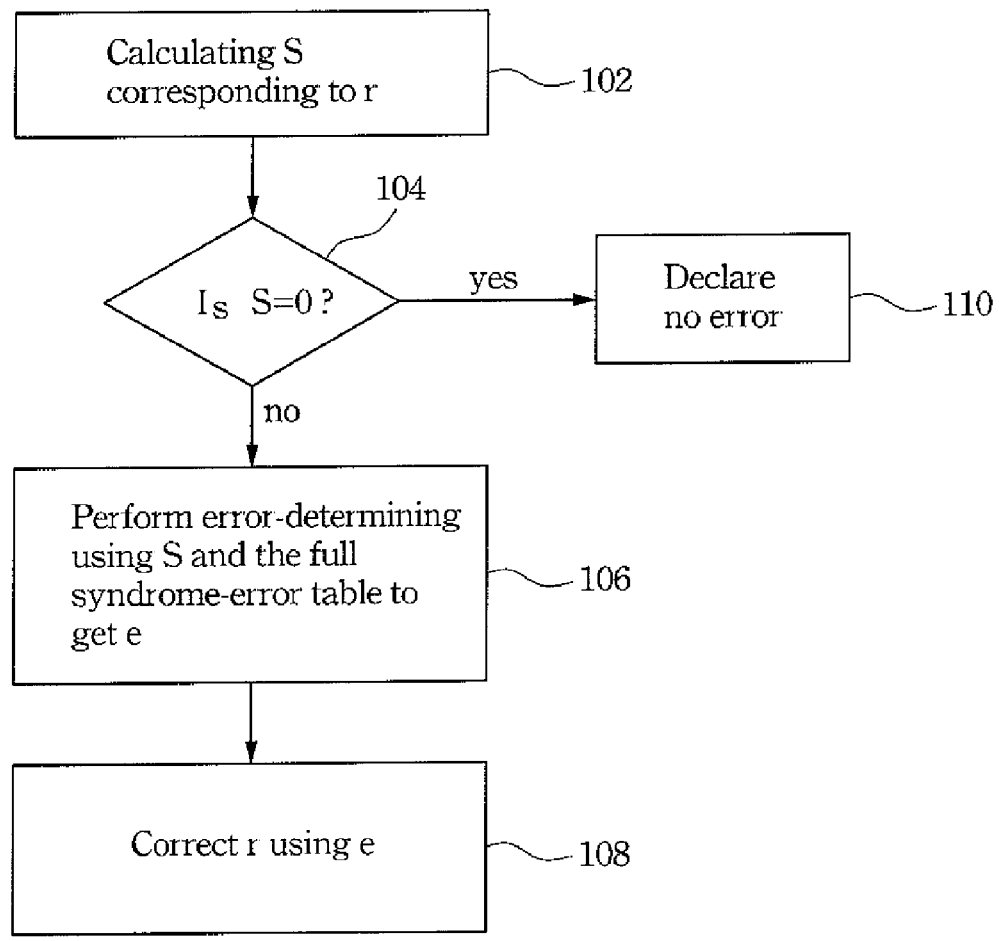
FIG. 1A is a flow-chart for decoding a linear or cyclic code in accordance with the first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The present invention provides a useful method of error-correction for the decoding of linear and cyclic codes, binary or non-binary, systematic or non-systematic, extended or non-extended. The improvement in the high-speed error-correcting capability over prior art methods is achieved by searching a syndrome-error table. The syndrome-error table is built upon the following mathematical basis: there is a one-to-one correspondence between the set of all syndromes and the set of all correctable error patterns. An error pattern is said to be correctable if its weight is less than or equal to the error-correcting capacity $$t = \left\lfloor \frac{d-1}{2} \right\rfloor,$$

where d is the minimum distance of the code, the notation $$\left\lfloor \frac{d-1}{2} \right\rfloor$$

means the largest integer not exceeding $$\frac{d-1}{2},$$

and the weight of bit string means the number of nonzero positions in the bit string.

Since the syndrome is the characteristic of the correctable error pattern hiding in the corrupted codeword, it depends only on the error pattern. That is, the syndrome is determined uniquely by the correctable error pattern. One single correctable error pattern cannot derive two different syndromes. From the other perspective, if there are two correctable error patterns e and e', whose associated syndromes are identical, then the syndrome of the difference e–e' equals zero. This implies that the difference e–e' is actually a codeword. Since the weight of e–e' is not greater than the sum of the weight of e and e', that is wt(e–e')≦wt(e)+wt(e–e'), the weight of e–e' is at most t+t=2t, where t is the error-correcting capacity. We have that the weight of e–e' is less than d, the minimum distance of the codeword, which is absurd for linear or cyclic codes.

By using the correspondence between syndromes and correctable error patterns, a useful syndrome-error table can be built and used in the decoding process. A syndrome serves as the input to the syndrome-error table, and the output is the corresponding correctable error pattern. This avoids the complicated computations to determine the error pattern from the syndrome.

The two embodiments are hereinafter described in detail. Referring now primarily to FIG. 1A, the method for decoding a linear or cyclic code in accordance with the first embodiment of the present invention is hereinafter described. At step 102, calculate a syndrome S corresponding to the received bit string r. In the case of cyclic codes, the common uses of syndromes contain the remainder of the received polynomial divided by the generator polynomial and the evaluation of the received polynomial at the roots of the generator polynomial. In the case of linear codes, the common use of syndromes includes the vector obtained by multiplying the received codeword by the parity check matrix. Then at step 104, determine whether or not the syndrome S obtained at step 102 is a zero bit string. When the syndrome S is not a zero bit string, use this syndrome to determine an error pattern e from the full syndrome-error table and obtain the error pattern e at step 106. Otherwise, when the syndrome S equals zero, declare no error occurred at step 110. The determination of the error pattern can be performed by look-up table or logic function methods. These methods of error determination are described later with reference to FIG. 1B. Finally, at step 108, the original information message can be recovered by performing a modulo-2 addition method of the information parts of both the error pattern and the corrupted codeword.

Figure 1B:
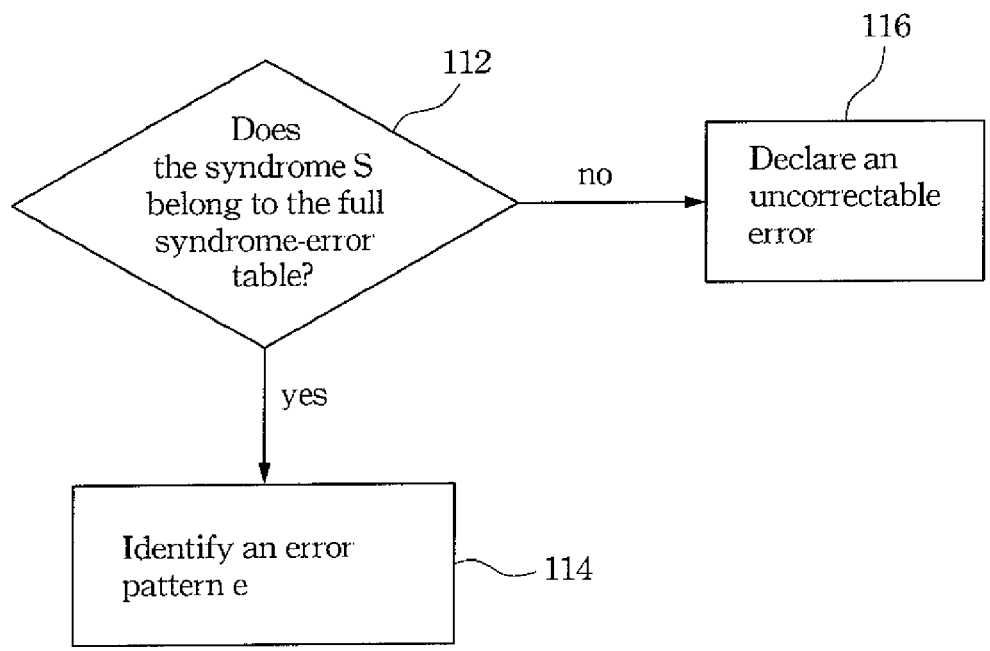
FIG. 1B is a flow-chart for determining the error pattern by using the full syndrome-error table in accordance with the first embodiment of the present invention.

Referring now primarily to FIG. 1B, the method using the full syndrome-error table in accordance with the first embodiment of the present invention is hereinafter described. At step 112, determining whether or not the syndrome S belongs to the full syndrome-error table. Then, at step 114, when the syndrome S belongs to the full syndrome-error table, identifying the corresponding error pattern e. Otherwise, when the syndrome S does not belong to the full syndrome-error table, an uncorrectable error has occurred at step 116.

The following is one of the illustrations about the determination of error pattern from the syndrome in the syndrome-error table: Let $e=(e_0, e_1, \ldots, e_{k-1})$ be the information part of error pattern occurred. Then each error positions $e_i$, $i=0, 1, \ldots, k-1$, can be expressed as logical function $e_i = f_i(S_0, S_1, \ldots, S_{m-1})$, where $S_0, S_1, \ldots, S_{m-1}$ are the syndrome bits in the syndrome S obtained from the corrupted codeword, and can be calculated directly once the syndrome S is determined. In more detail:

Let $e=(e_0, e_1, \ldots, e_{k-1})$ be the information part of error pattern occurred and S the syndrome obtained. Then there exist logical functions $f_0, f_1, \ldots, f_{k-1}$ such that each error position can be determined by evaluating the logical function at the syndrome bits:

$$e_0 = f_0(S_0, S_1, \ldots, S_{m-1})$$
$$e_1 = f_1(S_0, S_1, \ldots, S_{m-1})$$
$$\vdots$$
$$e_{k-1} = f_{k-1}(S_0, S_1, \ldots, S_{m-1})$$

Therefore, the original information message can be recovered by performing a modulo-2 addition method of the information parts of both the error pattern and the corrupted codeword.

A specific example of the first embodiment is described below. Consider a binary cyclic code (17, 9) with the generator polynomial $g(x)=x^8+x^7+x^6+x^4+x^2+x+$. Table 1 is a full syndrome-error table, and it contains all the correctable error patterns as well as the corresponding syndromes. Let $r=(11101111101111111)$ be the received bit string. Then the associated received polynomial is the polynomial $r(x)=x^{16}+x^{15}+x^{14}+x^{12}+x^{11}+x^{10}+x^9+x^8+x^7+x^6+x^5+x^4+x^3+x^2+x+1$.

First, calculate the syndrome S corresponding to r by dividing the received polynomial r(x) by the generator polynomial g(x) to obtain the remainder $x^4+x^3+x+1$. The syndrome S=(00011011) is the coefficient vector associated to the remainder. Since the syndrome S is not a zero bit string, the received bit string is a corrupted codeword. In addition, since the syndrome S belongs to Table 1, we can determine the information part of error pattern by looking up Table 1 or using logical function to determine directly the information part of error pattern according to the obtained syndrome S=(00011011) as following: $e_0=f_0(0,0,0,1,1,0,1,1)=1$, $e_1=f_1(0,0,0,1,1,0,1,1)=0$, $e_2=f_2(0,0,0,1,1,0,1,1)=0$, $e_3=f_3(0,0,0,1,1,0,1,1)=0$, $e_4=f_4(0,0,0,1,1,0,1,1)=0$, $e_5=f_5(0,0,0,1,1,0,1,1)=1$, $e_6=f_6(0,0,0,1,1,0,1,1)=0$, $e_7=f_7(0,0,0,1,1,0,1,1)=0$, and $e_8=f_8(0,0,0,1,1,0,1,1)=0$ and then get the information part of the error pattern (000100001). Next, the modulo-2 addition of the information parts of both the error pattern (000100001)

and the corrupted codeword (111011110) gives the original information message (111111111).

TABLE 1

| Syndrome | Information Part of Error Pattern |
|---|---|
| 00011001 | 100000100 |
| 00011011 | 000100001 |
| 00011111 | 000010010 |
| 00100101 | 000000101 |
| 00100111 | 100100000 |
| 00101001 | 001010000 |
| 00110011 | 000001000 |
| 00110110 | 001000010 |
| 00111100 | 100000001 |
| 00111110 | 000100100 |
| 01001001 | 010000001 |
| 01001010 | 000001010 |
| 01001111 | 001000000 |
| 01010010 | 010100000 |
| 01010101 | 000011000 |
| 01100110 | 000010000 |
| 01101100 | 010000100 |
| 01110101 | 110000000 |
| 01111001 | 000000010 |
| 01111100 | 001001000 |
| 10000011 | 001100000 |
| 10001011 | 000000110 |
| 10001101 | 100010000 |
| 10010010 | 100000010 |
| 10010100 | 000010100 |
| 10011000 | 001000001 |
| 10011110 | 010000000 |
| 10100100 | 101000000 |
| 10101010 | 000110000 |
| 10101101 | 010001000 |
| 10101110 | 000000011 |
| 10110001 | 000010001 |
| 10110101 | 000100010 |
| 10111101 | 001000100 |
| 11000001 | 000001100 |
| 11001100 | 000100000 |
| 11010001 | 011000000 |
| 11010111 | 000000001 |
| 11011000 | 100001000 |
| 11100100 | 000001001 |
| 11100111 | 010000010 |
| 11101011 | 100000000 |
| 11110010 | 000000100 |
| 11111000 | 010010000 |
| 11111111 | 000101000 |

Figure 2A:
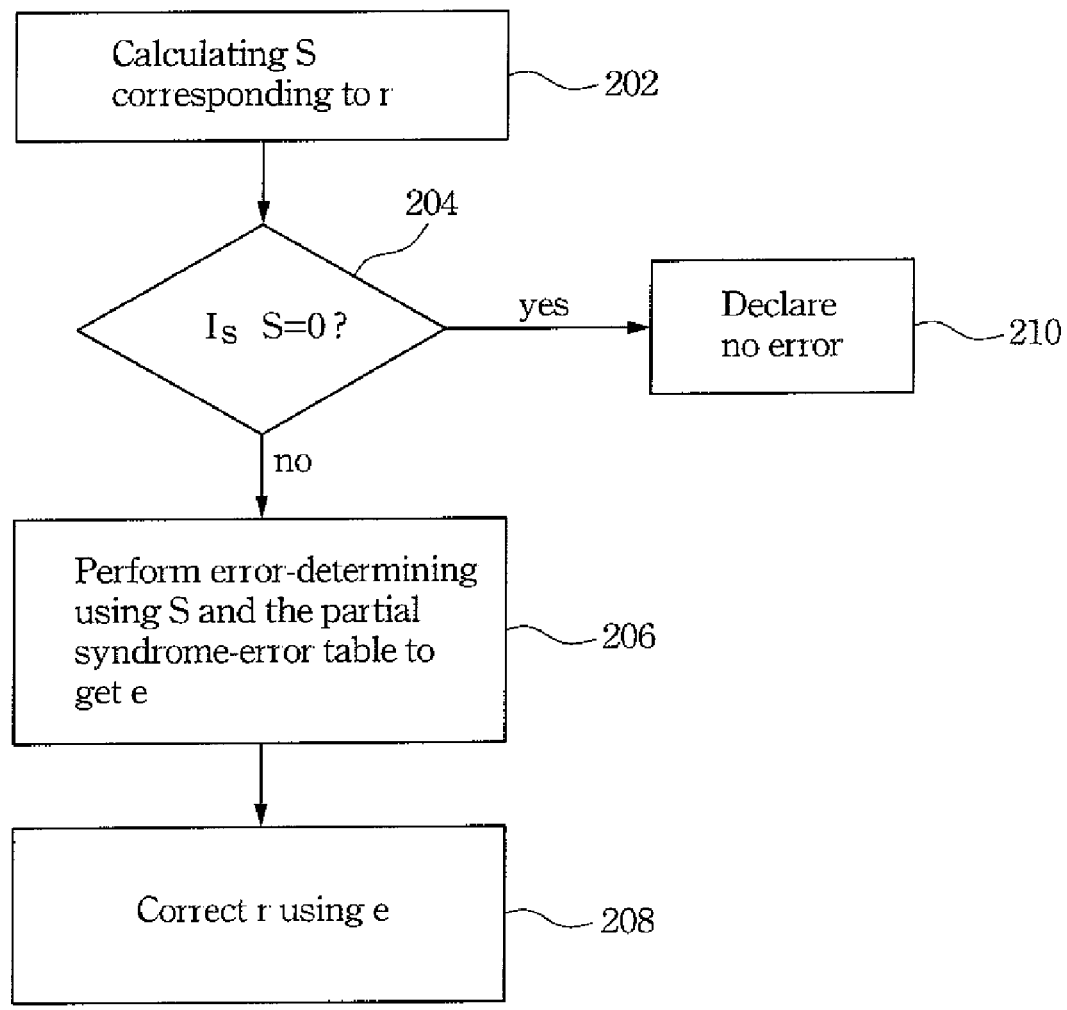
FIG. 2A is a flow-chart for decoding a linear or cyclic code in accordance with the second embodiment of the present invention.

Referring now primarily to FIG. 2A, the method for decoding a linear or cyclic code in accordance with the second embodiment of the present invention is hereinafter described. At step 202, calculate syndrome S corresponding to the received bit string r. In the case of cyclic codes, the common uses of syndromes contain the remainder of the received polynomial divided by the generator polynomial and the evaluation of the received polynomial at the roots of the generator polynomial. In the case of linear codes, the common use of syndromes includes the vector obtained by multiplying the received bit string by the parity check matrix. Then at step 204, determine whether or not the syndrome S obtained at step 202 is a zero bit string. When the syndrome S is not a zero bit string, find an error pattern e corresponding to the syndrome S from the partial syndrome-error table at step 206. Otherwise, when the syndrome S equals zero, then no error has occurred at step 210. The method of error determination is described later with reference to FIG. 2B. Step 208 is performing a modulo-2 addition method of the information parts of both the error pattern e and the corrupted codeword r.

Figure 2B:
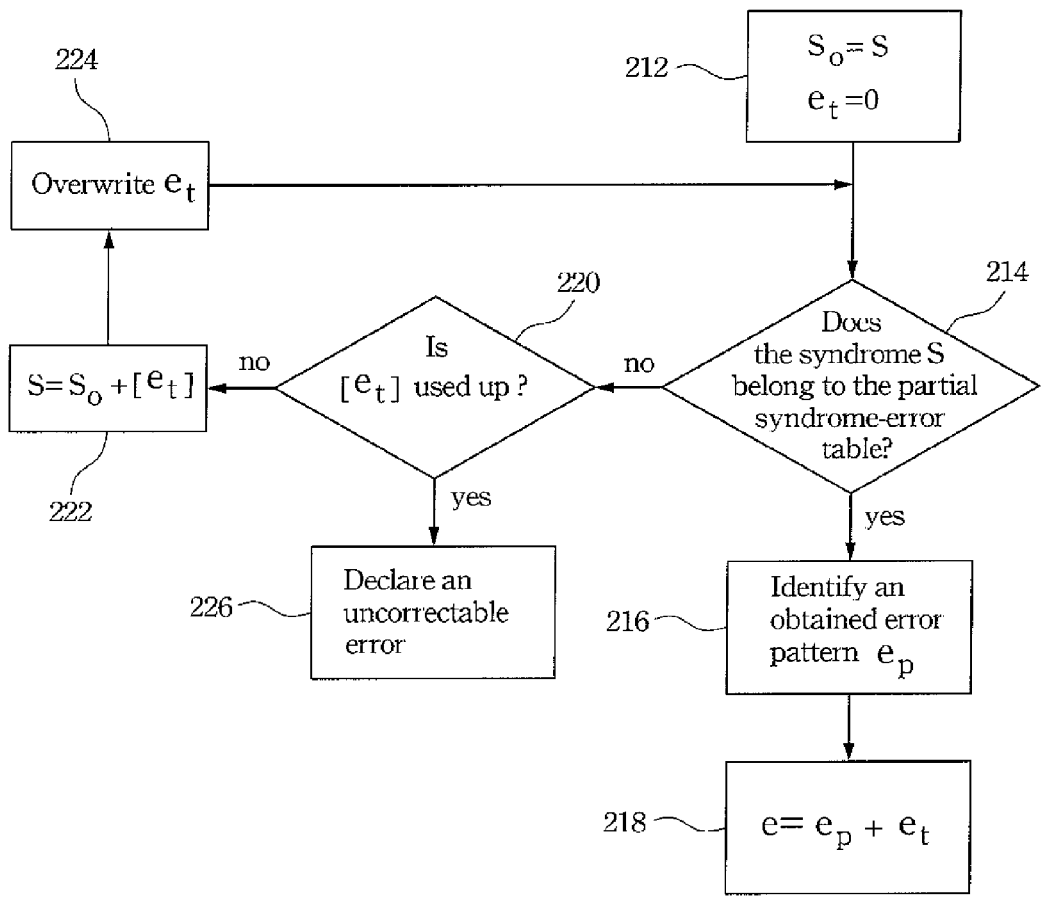
FIG. 2B is a flow-chart for error-trying using the partial syndrome-error table in accordance with the second embodiment of the present invention.

Referring now primarily to FIG. 2B, the method using the partial syndrome-error table in accordance with the second embodiment of the present invention is hereinafter described. The partial syndrome-error table contains a proper subset of the set of all syndromes and the corresponding correctable error patterns. Pre-calculated syndromes $[e_t]$ are those syndromes corresponding to the correctable error patterns not in the partial syndrome-error table, and the notation $[e_t]$ indicates the syndrome associated with the error pattern $e_t$.

At step 212, assign a starting syndrome $S_0$ to the syndrome S and a trying error pattern $e_t$ to zero. Then, at step 214, determine whether or not the syndrome S belongs to the partial syndrome-error table. At step 216, when the syndrome S belongs to the partial syndrome-error table, identify the corresponding error pattern $e_p$. Otherwise, when the syndrome S does not belong to the partial syndrome-error table, check whether all the pre-calculated syndromes $[e_t]$ are used up or not at step 220. If pre-calculated syndromes $[e_t]$ are not used up, choose one of them and add it to the starting syndrome $S_0$, and assign this sum to be the new value of the syndrome S at step 222. Thereafter, at step 224, overwrite the trying error pattern $e_t$ with the error pattern corresponding to this pre-calculated syndrome $[e_t]$. On the other hand, if all the pre-calculated syndromes $[e_t]$ are used up and no error patterns emit, declare that an uncorrectable error has occurred at step 226.

While the syndrome S does not belong to the partial syndrome-error table and the pre-calculated syndromes are not used up, the process of adding the starting syndrome $S_0$ and one of the pre-calculated syndromes $[e_t]$ would be repeated until the sum of the starting syndrome $S_0$ and one of the pre-calculated syndromes $[e_t]$ can be found in the partial syndrome-error table or otherwise all the pre-calculated syndromes $[e_t]$ are used up. If some error pattern $e_p$ is emitted, then assign the result of a modulo-2 addition of the information parts of both the obtained error pattern $e_p$ and the trying error pattern $e_t$ to be the information part of the error pattern e at step 218.

A specific example of the second embodiment is described below. Consider a binary cyclic code (17, 9) with the generator polynomial $g(x)=x^8+x^7+x^6+x^4+x^2+x+1$. Table 2 is a partial syndrome-error table, which contains part of the correctable error patterns and the corresponding syndromes. Let r=(11101111101111111) be the received bit string. Then the received polynomial is the associated polynomial $r(x)=x^{16}+x^{15}+x^{14}+x^{12}+x^{11}+x^{10}+x^9+x^8+x^7+x^6+x^5+x^4+x^3+x^2+x+1$. First, calculate the syndrome S corresponding to r by dividing the received polynomial r(x) by the generator polynomial g(x) to obtained the remainder $x^4+x^3+x+1$. The syndrome S=(00011011) is the coefficient vector associated to the remainder. Since S=(00011011) is not a zero bit string, the received bit string is a corrupted codeword. To remove the error pattern hiding in the corrupted codeword, we assign a starting syndrome $S_0$ to the syndrome S; that is, $S_0=S=$ (00011011). Since the syndrome S=(00011011) is not found on Table 2, the pre-calculated syndrome $[e_t]$ of some trying error pattern will be added to the starting syndrome $S_0$. After trying, the trying error pattern $e_t$=(00000000100000000) with the associated pre-calculated syndrome $[e_t]$= (11010111) is the one we want. Add this pre-calculated syndrome (11010111) to the starting syndrome (00011011) and save this value as the syndrome S. That is, $S=S_0+[e_t]=$ (11001100). In this case, the syndrome S=(11001100) is found in Table 2, and we can determine the information part of error pattern by looking up Table 2 or using logical function to determine directly the information part of error pattern according to the obtained syndrome S=(11001100) as following: $e_{p0}=f_0(1,1,0,0,1,1,0,0)=0$, $e_{p1}=f_1(1,1,0,0,1,1,0,0)=0$, $e_{p2}=f_2(1,1,0,0,1,1,0,0)=0$, $e_{p3}=f_3(1,1,0,0,1,1,0,0)=0$, $e_{p4}=f_4$ (1,1,0,0,1,1,0,0)=0, $e_{p5}$=$f_5$(1,1,0,0,1,1,0,0)=1, $e_{p6}$=$f_6$(1,1,0,0,1,1,0,0)=0, $e_{p7}$=$f_7$(1,1,0,0,1,1,0,0)=0, and $e_{p8}$=$f_8$(1,1,0,0,1,1,0,0)=0 and then get the corresponding information part of error pattern $e_p$=(000100000). Next, the modulo-2 addition of the information parts of both the obtained error pattern $e_p$=(000100000) and the trying error pattern (000000001) gives the error bit string e=(000100001). Finally, the modulo-2 addition of the obtained e=(000100001) and the information part of the corrupted codeword (111011110) gives the original information message (111111111).

TABLE 2

| Syndrome | Information Part of Error Pattern |
|---|---|
| 00110011 | 000001000 |
| 01001111 | 001000000 |
| 01100110 | 000010000 |
| 01111001 | 000000010 |
| 10011110 | 010000000 |
| 11001100 | 000100000 |
| 11010111 | 000000001 |
| 11101011 | 100000000 |
| 11110010 | 000000100 |

An advantage of the present invention is that it provides a useful method for decoding linear and cyclic codes that can be implemented in most major and real-time applications. This is a fast and simple approach for decoding linear and cyclic codes, binary or non-binary, systematic or non-systematic, extended or non-extended. The improvement in the high-speed error-correcting capability is achieved by determining directly the error pattern from a suitable syndrome-error table.

The present invention may be embodied in software or hardware. The common software embodiments of the present invention include using code or data memory to store the syndrome-error table, or using mathematical functions based on the syndrome-error table. The common hardware embodiments of the present invention include using memory devices to store the syndrome-error table, or using the combinational logic circuits/logic functions to perform the mapping between syndromes and error patterns. This method is claimed to include any means of reform or simplification of the mentioned mapping between syndromes and error patterns.

Although the present invention has been described in considerable detail with reference to certain preferred embodiments thereof, other embodiments are possible. Therefore, the spirit and scope of the appended claims should not be limited to the description of the preferred embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method to correct errors in a received bit string, the method comprising:
    calculating a syndrome corresponding to the received bit string;
    evaluating a plurality of logical functions with respect to a set of all syndromes respectively to obtain a set of all correctable error patterns, wherein the value of each error position of each correctable error pattern is determined individually by using a corresponding logical function of syndrome bits of a corresponding syndrome;
    constructing a full syndrome-error table containing the set of all syndromes and the set of all correctable error patterns corresponding to the set of all syndromes in a one-to-one manner;
    determining whether or not the syndrome is a zero bit string, wherein when the syndrome is not a zero bit string, the received bit string is a corrupted codeword;
    determining an error pattern directly by searching the full syndrome-error table in accordance with the syndrome when the syndrome is not a zero bit string; and
    correcting the corrupted codeword using the error pattern.

2. The method according to claim 1, further comprising that declaring no error has occurred when the syndrome is a zero bit string.

3. The method according to claim 1, wherein the received bit string is encoded using an error-correcting code based on a syndrome decoding scheme.

4. The method according to claim 3, wherein the syndrome decoding scheme means the set of all syndromes is one-to-one corresponding to the set of all correctable error patterns.

5. The method according to claim 3, wherein the syndrome decoding scheme includes linear and cyclic codes, binary or non-binary, systematic or non-systematic, extended or non-extended.

6. The method according to claim 1, wherein the step of determining the error pattern comprises the sub-steps of:
    determining whether the syndrome belongs to the full syndrome-error table; and
    identifying the corresponding error pattern when the syndrome belongs to the full syndrome-error table.

7. The method according to claim 6, further comprising that declaring an uncorrectable error has occurred when the syndrome does not belong to the full syndrome-error table.

8. The method according to claim 1, wherein the step of determining the error pattern is implemented in software by using memory to store the syndrome-error table.

9. The method according to claim 1, wherein the step of determining the error pattern is implemented in hardware by using memory devices to store the syndrome-error table, or using the logic functions to perform the mapping between syndromes and error patterns.

10. The method according to claim 1, wherein the step of correcting the corrupted codeword comprises performing a modulo-2 addition method of the corrupted codeword and the error pattern.

11. A method to correct errors in a received bit string, the method comprising:
    calculating a syndrome corresponding to the received bit string;
    evaluating a plurality of logical functions with respect to a set of all syndromes to obtain a set of all correctable error patterns, wherein the value of each error position of each correctable error pattern is determined individually by using a corresponding logical function of syndrome bits of a corresponding syndrome;
    constructing a partial syndrome-error table containing a proper subset of the set of all syndromes and the corresponding correctable error patterns in a one-to-one manner;
    determining whether or not the syndrome is a zero bit string;
    determining an error pattern directly by searching the partial syndrome-error table in accordance with the syndrome when the syndrome is not a zero bit string, wherein the step of determining the error pattern comprises the sub-steps of:
assigning a starting syndrome to the syndrome calculated from the corrupted codeword and set a trying error pattern to be zero;
determining whether or not the syndrome belongs to the partial syndrome-error table;
identifying the error pattern when the syndrome belongs to the partial syndrome-error table, thereby determining the value of each error position of the received bit string individually; and
performing a modulo-2 addition method of the obtained error pattern and the trying error pattern; and
correcting the corrupted codeword using the error pattern.

12. The method according to claim 11, further comprising that declaring no error has occurred when the syndrome is a zero bit string.

13. The method according to claim 11, wherein the received bit string is encoded using an error-correcting code based on a syndrome decoding scheme.

14. The method according to claim 13, wherein the syndrome decoding scheme means the set of all syndromes is one-to-one corresponding to the set of all correctable error patterns.

15. The method according to claim 13, wherein the syndrome decoding scheme includes linear and cyclic codes, binary or non-binary, systematic or non-systematic, extended or non-extended.

16. The method according to claim 11, further comprising:
providing a plurality of pre-calculated syndromes, wherein the pre-calculated syndromes are those syndromes corresponding to some certain error patterns;
checking whether all the pre-calculated syndromes are used up or not when the syndrome does not belong to the partial syndrome-error table; and
declaring that an uncorrectable error has occurred when the pre-calculated syndromes are used up.

17. The method according to claim 16, further comprising:
adding the starting syndrome and one of the pre-calculated syndromes as the input to the partial syndrome-error table when the pre-calculated syndromes are not used up; and
saving the error pattern corresponding to the pre-calculated syndrome used above as the trying error pattern.

18. The method according to claim 11, wherein the step of determining the error pattern is implemented in software by using memory to store the partial syndrome-error table.

19. The method according to claim 11, wherein the step of determining the error pattern is implemented in hardware by using memory devices to store the partial syndrome-error table, or using the logic functions to perform the mapping between syndromes and error patterns.

20. The method according to claim 11, wherein the step of correcting the corrupted codeword comprises performing a modulo-2 addition method of the corrupted codeword and the error pattern.

* * * * *